(12) United States Patent
Huang et al.

(10) Patent No.: US 8,779,500 B2
(45) Date of Patent: Jul. 15, 2014

(54) MEMORY DEVICE

(75) Inventors: Yu-Fong Huang, Hsinchu (TW);
Miao-Chih Hsu, Hsinchu (TW);
Kuan-Fu Chen, Hsinchu (TW);
Tzung-Ting Han, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 217 days.

(21) Appl. No.: 12/691,964

(22) Filed: Jan. 22, 2010

(65) Prior Publication Data
US 2011/0180864 A1 Jul. 28, 2011

(51) Int. Cl.
*H01L 27/115* (2006.01)

(52) U.S. Cl.
USPC ............. 257/324; 257/E21.679; 257/E27.103

(58) Field of Classification Search
USPC ....................... 257/324, E21.679, E27.103
See application file for complete search history.

(56) References Cited

U.S. PATENT DOCUMENTS

| | | | |
|---|---|---|---|
| 6,486,028 B1 | 11/2002 | Chang et al. | |
| 6,916,715 B2 | 7/2005 | Hsiao et al. | |
| 6,943,074 B2 * | 9/2005 | Kamiya et al. | 438/211 |
| 2006/0043457 A1 | 3/2006 | Baik | |
| 2006/0267082 A1 | 11/2006 | Hofmann et al. | |
| 2009/0269895 A1 | 10/2009 | Kim et al. | |

OTHER PUBLICATIONS

"Second Office Action of China counterpart application" issued on Oct. 23, 2012, p. 1-p. 10.

* cited by examiner

*Primary Examiner* — Long Pham
(74) *Attorney, Agent, or Firm* — J.C. Patents

(57) ABSTRACT

A memory device is provided, including a substrate, a conductive layer, a charge storage layer, a plurality of isolation structures, a plurality of first doped regions, and a plurality of second doped regions. The substrate has a plurality of trenches. The conductive layer is disposed on the substrate and fills the trenches. The charge storage layer is disposed between the substrate and the conductive layer. The isolation structures are disposed in the substrate between two adjacent trenches, respectively. The first doped regions are disposed in an upper portion of the substrate between each isolation structure and each trench, respectively. The second doped regions are disposed in the substrate under a bottom portion of the trenches, in which each isolation structure is disposed between two adjacent second doped regions.

12 Claims, 8 Drawing Sheets

MEMORY DEVICE

BACKGROUND OF THE INVENTION

1. Field of the Invention

The invention generally relates to a memory device. More particularly, the invention relates to a memory device having a plurality of isolation structures and methods for fabricating the memory device.

2. Description of Related Art

Nowadays, a memory is typically a semiconductor device designed to store information or data. As the functionalities of computer microprocessors become more and more powerful, programs and operations executed by software are increasing correspondingly. As a consequence, the demand for high storage capacity memories is ever increasing. Among the plethora of memory products, the non-volatile memory allows repeated programming, readings, and erasures of data. Moreover, the stored data is retained even after power to the device is removed. In light of the aforementioned advantages, the non-volatile memory has become one of the most popular memory devices in personal computers and other electronic equipments.

Among non-volatile memories, the Electrically Erasable Programmable Read Only Memory (EEPROM) possesses the ability to store, read and erase data many times. Moreover, the EEPROM has the advantage that the stored data is not lost even after the system is power off. Therefore, the EEPROMs are widely used in the personal computers and electronic equipments. A typical EEPROM has a floating gate and a control gate fabricated from doped polysilicon. When the memory is being programmed, the electrons implanted into the floating gate are uniformly distributed in an entire polysilicon floating gate layer. However, if the tunnel oxide layer under the polysilicon floating gate layer has defects, it can easily cause a leakage current in the device, thereby affecting the reliability of the device.

Therefore, in order to solve the issue of current leakage in the EEPROM device, a conventional method utilizes stacked gate structures having a nonconductive charge storage layer to replace the polysilicon floating gate. Moreover, another advantage obtained from replacing the polysilicon floating gate with the charge storage layer is that the electrons are only locally stored in a neighboring portion of the channel region above the source region or the drain region while the device is programmed. Therefore, during the programming process, voltages can be respectively applied on the source region and the control gate of a terminal of the stacked gate structure. Furthermore, at the silicon nitride layer of the drain region near another terminal of the stacked gate structure, electrons are generated with a form of Gaussian distribution. Alternatively, voltages can be respectively applied on the drain region and the control gate of a terminal of the stacked gate structure. Moreover, at the silicon nitride layer of the source region near another terminal of the stacked gate structure, electrons are generated with a form of Gaussian distribution. In other words, by changing the voltages applied to the control gate and to either the source region or the drain region at the two sides, a single silicon nitride layer can have two storage regions that have electrons with a Gaussian distribution property, either one of the storage regions having electrons with the Gaussian distribution property, or none of the electrons stored in both storage regions. Hence, for this type of flash memory with the silicon nitride material replacing the floating goat, a single memory cell can be written with four different states. Therefore, this type of flash memory is considered a 2-bits-per-cell memory.

Conventionally, in order to increase the number of bits of a memory cell, a memory structure with a vertical memory cell is developed. This type of memory cell is a 4-bits-per-cell flash memory. However, between two adjacent vertical memory cells, the phenomenon of electron punching through happens easily. Hence, a significant leakage current in the memory structure is induced. Furthermore, since the vertical memory cells are too tightly disposed, disturbance is generated during programming.

Accordingly, needs exist for acquiring higher memory density while solving the aforementioned issues and maintaining the performance levels of the memory device.

SUMMARY OF THE INVENTION

Accordingly, an embodiment of the invention provides a memory device having a plurality of isolation structures.

Another embodiment of the invention provides a method for fabricating the memory device, for effectively isolating a plurality of doped regions and decreasing the device dimensions.

Another embodiment of the invention provides a memory device including a substrate, a conductive layer, a charge storage layer, a plurality of isolation structures, a plurality of first doped regions, and a plurality of second doped regions. The substrate has a plurality of trenches. The conductive layer is disposed on the substrate and fills the trenches. The charge storage layer is disposed between the substrate and the conductive layer. The isolation structures are respectively disposed in the substrate between two adjacent trenches. The first doped regions are respectively disposed in an upper portion of the substrate between each of the isolation structures and each of the trenches. The second doped regions are respectively disposed under the substrate at a bottom portion of the trenches, and each of the isolation structures is disposed between two adjacent second doped regions.

Another embodiment of the invention provides a memory device including a substrate, a conductive layer, a charge storage layer, a plurality of isolation structures, a plurality of first doped regions, and a plurality of second doped regions. The substrate has a plurality of first portions and a plurality of second portions. Each of the first portions has a first upper surface having a first height, whereas each of the second portions has a second upper surface having a second height. The first height is higher than the second height. The conductive layer is disposed on the substrate and covers the first upper surface and the second upper surface. The charge storage layer is disposed between the substrate and the conductive layer. The isolation structures are respectively disposed in the first portions of the substrate. The first doped regions are respectively disposed in the first portions of the substrate, and the first doped regions are respectively disposed at two upper sides of each of the isolation structures. The second doped regions are respectively disposed in the second portions of the substrate, in which each of the isolation structures is disposed between two adjacent second doped regions.

In one embodiment of the present invention, the memory device further includes a bottom dielectric layer disposed between the charge storage layer and the substrate, and a top dielectric layer disposed between the charge storage layer and the conductive layer.

An embodiment of the invention provides a method for fabricating a memory device. A plurality of isolation spaces and a plurality of trenches are formed in the substrate, wherein each of the spaces and each of the trenches are alternately arranged. An isolation structure is formed in each of the isolation spaces and filling the isolation space. A plurality of first doped regions and a plurality of second doped regions are formed in the substrate. The first doped regions are respectively formed in the upper portion of the substrate between each of the trenches and each of the isolation structures. The second doped regions are respectively formed in the substrate under the substrate at the bottom portion of the trenches, and each of the isolation structures is disposed between two adjacent second doped regions. A charge storage layer is conformally formed on the surfaces of the substrate and the trenches. A conductive layer covering the charge storage layer and filling the trenches is formed on the substrate.

In one embodiment of the invention, forming the isolation spaces includes the following processes. A patterned hard mask layer having a plurality of openings is formed on the substrate. A plurality of spacers is formed on sidewalls of the patterned hard mask layer, in which two adjacent spacers disposed in each of the openings are not in contact with each other. By using the patterned hard mask layer and the spacers as a mask, a portion of the substrate is removed for forming the isolation spaces. The aforementioned patterned hard mask layer, the spacers, and the substrate have, for example, different etching selectivities. The material of the patterned hard mask layer includes silicon nitride, and the material of the spacer wall includes silicon oxide, for example and not limited thereto.

In one embodiment of the invention, forming the trenches includes the following processes. The patterned hard mask layer and a portion of the substrate disposed below the patterned hard mask layer are removed, so as to form the trenches. The spacers are removed.

In one embodiment of the invention, before forming the aforementioned patterned hard mask layer, the method further includes forming a buffer layer on the surface of the substrate.

In one embodiment of the invention, while forming the aforementioned isolation structures, the method further includes forming an oxide layer on the surfaces of the sidewalls of the trenches.

In one embodiment of the invention, forming the isolation structures includes performing an oxidation process.

In one embodiment of the present invention, a depth of the aforementioned isolation structures is deeper than a depth of the second doped regions.

In one embodiment of the invention, the depth of the aforementioned isolation structures is approximately 0.15 μm to 0.35 μm.

In one embodiment of the invention, a width of the isolation structures is approximately 0.005 μm to 0.03 μm.

In one embodiment of the present invention, the material of the aforementioned isolation structures includes, for example but not limited to, silicon oxide.

In one embodiment of the invention, forming the first doped regions and the second doped regions includes performing a vertical ion implantation process.

In one embodiment of the invention, the method for fabricating the memory device further includes forming a plurality of first contacts on the first doped regions, and forming a plurality of second contacts on the second doped regions.

In one embodiment of the present invention, the method for fabricating the memory device further includes the following processed. A bottom dielectric layer is formed between the charge storage layer and the substrate, and a top dielectric layer is formed between the charge storage layer and the conductive layer.

In summary, the memory device according to embodiments of the invention has isolation structures, thereby isolating the vertical channel regions of adjacent memory cells, and effectively suppressing the operational disturbance between memory cells arising from secondary electrons. Moreover, the isolation structures can isolate adjacent second doped regions, thereby shrinking the pitch between adjacent second doped regions, and preventing a punch through phenomenon between the second doped regions.

Furthermore, according to embodiments of the invention, the method for fabricating the memory device performs the oxidation process to form the isolation structures, before performing the ion implantation process, thereby preventing dopants from being implanted in the substrate under the bottom portion of the isolation structures, and thus effectively isolating adjacent second doped regions. Therefore, by applying the method for fabricating the memory device according to embodiments of the invention, the memory cells formed have smaller dimensions and larger storage density.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
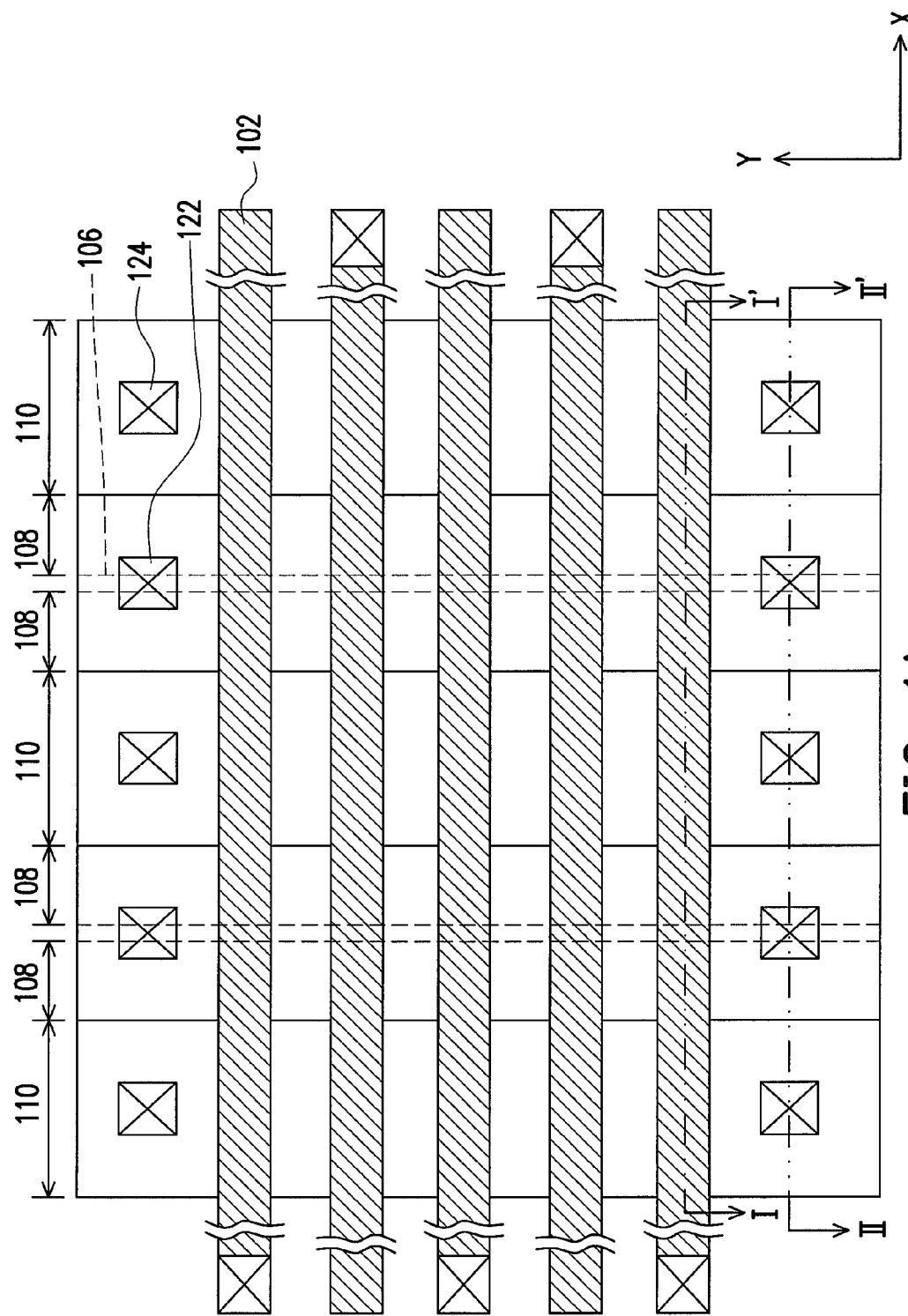
FIG. 1A is a schematic top view of a memory device layout in accordance with one embodiment of the invention.
Figure 1B:
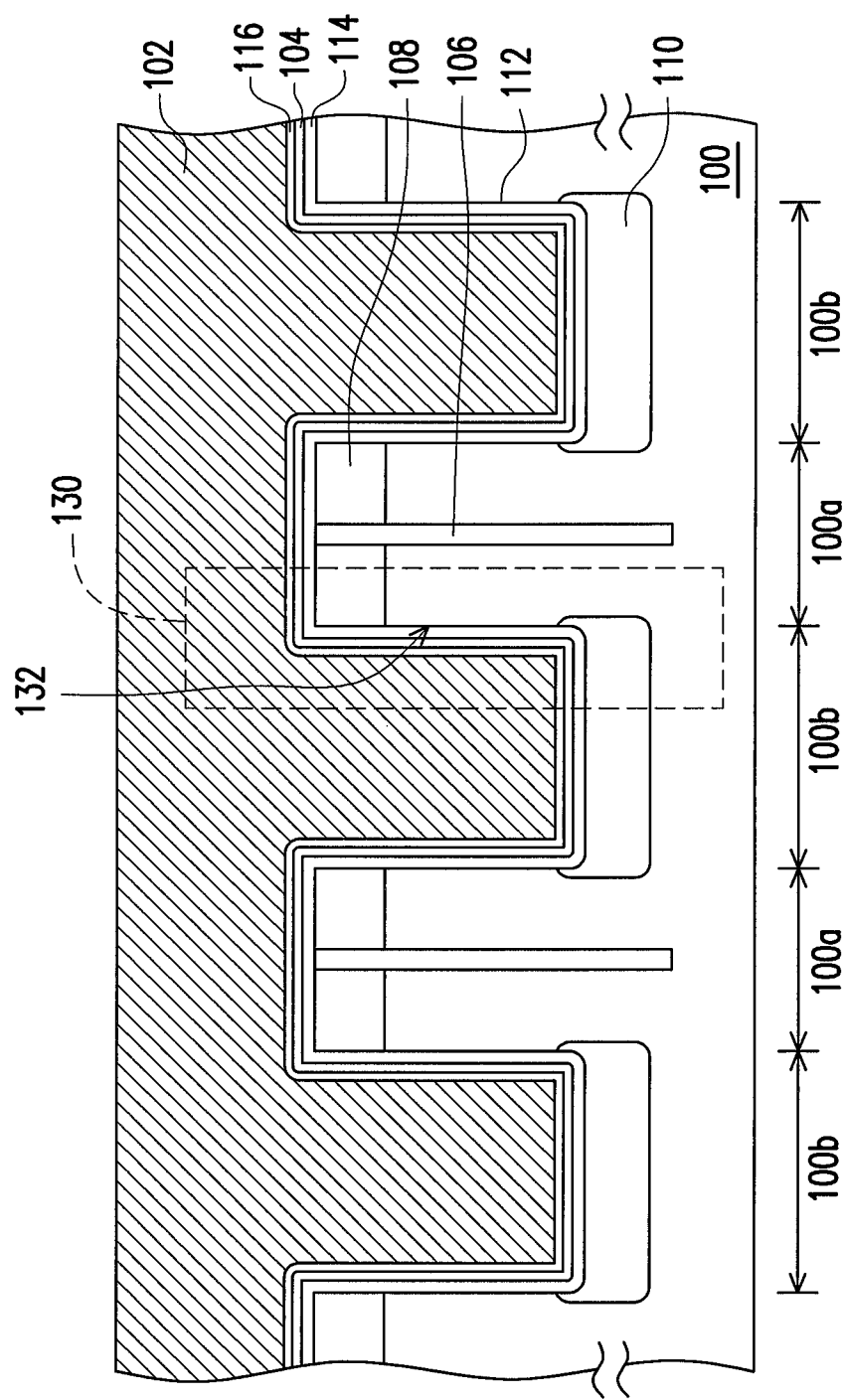
FIG. 1B is a schematic cross-sectional view taken along the line section I-I' in FIG. 1A.
Figure 1C:
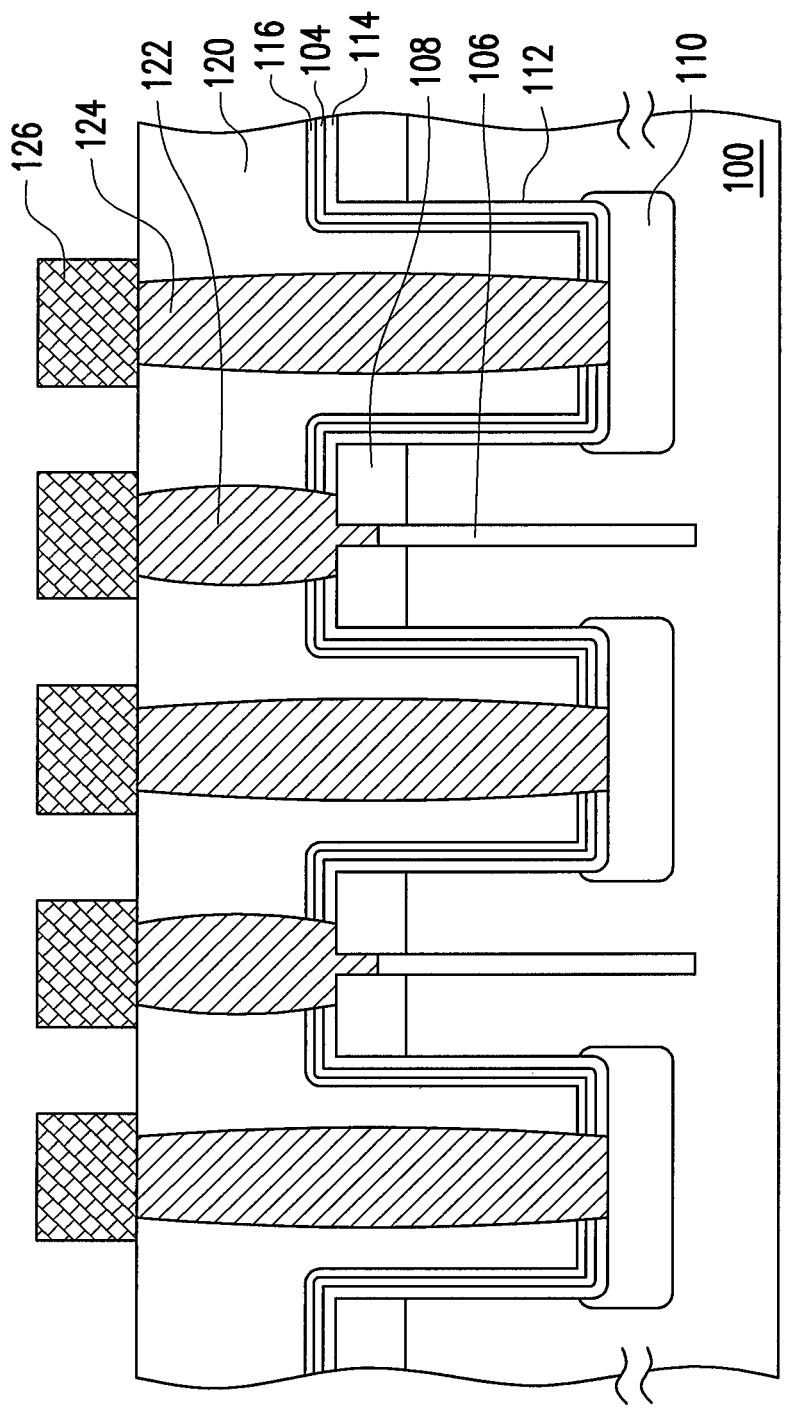
FIG. 1C is a schematic cross-sectional view taken along the line section II-II' in FIG. 1A.

FIG. 1A is a schematic top view of a memory device layout in accordance with one embodiment of the invention. In order to simplify the drawing for ease of description, FIG. 1A mainly illustrates the layout of the word lines, the bit lines, the doped regions, and the isolation structures. FIG. 1B is a schematic cross-sectional view taken along the line section I-I' in FIG. 1A. FIG. 1C is a schematic cross-sectional view taken along the line section II-II' in FIG. 1A.

Referring concurrently to FIGS. 1A and 1B, a memory device according to one embodiment of the invention includes a substrate 100, a conductive layer 102, a charge storage layer 104, a plurality of isolation structures 106, a plurality of first doped regions 108, and a plurality of second doped regions 110. The substrate 100 can be a P-type or a N-type substrate that is a silicon substrate or other proper semiconductor substrates. In one embodiment of the invention, a plurality of wells (not drawn) can be disposed in the substrate 100. When the memory device is a N-type channel device, the wells can be P-type wells; when the memory device is a P-type channel device, the wells can be N-type wells. The substrate 100 has a plurality of trenches 112 configured to be parallel to each other. The trenches 112 can be extending in a Y direction indicated by FIG. 1A. In one embodiment of the invention, a depth of the trenches 112 is approximately 0.15 μm to 0.35 μm, and a width of the trenches 112 is approximately 0.05 μm to 0.25 μm. Moreover, a pitch between adjacent trenches 112 can be appropriately defined to provide sufficient space so that interference can be avoided during programming. In one embodiment of the invention, the pitch between adjacent trenches 112 is approximately 0.05 µm to 0.25 µm. In another embodiment of the invention, the substrate 100 has a plurality of first portions 100a and a plurality of second portions 100b. The first portions 100a have a first upper surface having a first height, and the second portions have a second upper surface having a second height. The first height is higher than the second height. In other words, the trenches 112 can be correspondingly disposed, for example, in the second portions 100b of the substrate 100. Moreover, a portion between two adjacent trenches 112 can correspond, for instance, to the first portions 100a of the substrate 100.

The conductive layer 102 is disposed on the substrate 100 and fills the trenches 112. The conductive layer 102 also covers the first upper surface of the first portions 100a and the second upper surface of the second portions 100b. A material of the conductive layer is, for example but not limited to, doped polysilicon, metal, or a combination thereof. The conductive layer 102 can be extending along an X direction shown in FIG. 1A to form a word line.

The charge storage layer 104 is disposed and extended between the conductive layer 102 and the substrate 100. The material of the charge storage layer 104 includes, for example but not limited to, charge-trapping materials such as silicon nitride. In one embodiment of the invention, the memory device further includes a bottom dielectric layer 114 and a top dielectric layer 116. The bottom dielectric layer 114 is disposed below the charge storage layer 104, and the top dielectric layer 116 is disposed above the charge storage layer 104, thereby a composite dielectric layer is formed. The bottom dielectric layer 114 can be disposed between the charge storage layer 104 and the substrate 100. In one embodiment of the invention, the bottom dielectric layer 114 includes a dielectric material, such as a low-K material or a high-K material, formed in a single layer structure. The low-k material is silicon oxide, for example, whereas the high-k material can be HfAlO. In one embodiment of the invention, the bottom dielectric layer 114 can be formed by a bandgap engineered multi-layer structure that is capable of achieving higher injection current, faster programming speed, and more favorable data retention. When the bottom dielectric layer 114 includes a plurality of thin films, the thin films have a stacked low-k/high-k material structure or a stacked low-k/high-k/low-k material structure. The stacked low-k/high-k material structure can be SiO/HfSiO, SiO/HfO$_2$, or SiO/SiN. The stacked low-k/high-k/low-k material structure can be SiO/SiN/SiO or SiO/Al$_2$O$_3$/SiO. The top dielectric layer 116 can be disposed, for example, between the charge storage layer 104 and the substrate 102. In one embodiment of the invention, the top dielectric layer 116 can include a dielectric material formed in a single layer structure, for example but not limited to SiO, HfAlO, or Al$_2$O$_3$.

The isolation structures 106 are disposed in the substrate 100 between adjacent trenches 112. More specifically, the isolation structures 106 can be disposed, for example, in the first portions 100a of the substrate 100, and the isolation structures 106 extend downwards from the first upper surface of the first portions 100a. The isolation structures 106 can be extending in a Y direction indicated by FIG. 1A. In one embodiment of the invention, the depth of the isolation structures is approximately 0.15 µm to 0.35 µm, and the width of the isolation structures is approximately 0.005 µm to 0.03 µm. The material of the isolation structures 106 includes silicon oxide.

The first doped regions 108 can be buried diffusion regions, for example, and the first doped regions 108 are respectively disposed in the substrate 100 at two sides of an upper portion of each of the isolation structures 106. The first doped regions 108 can be disposed in the first portions 100a, and the first doped regions 108 can be respectively disposed at two upper sides of the isolation structures 106. The first doped regions 108 can be extending along the Y direction shown in FIG. 1A to form bit lines. More specifically, the first doped regions 108 are disposed in an upper portion of the substrate 100 between the isolation structures 106 and the sidewalls of the trenches 112. The isolation structures 106 separates two first doped regions 108 disposed between adjacent trenches 112 from each other.

The second doped regions 110 can be buried diffusion regions, for example, and the second doped regions 110 are respectively disposed in the substrate 100 under a bottom portion of the trenches 112. More specifically, the second doped regions 110 can be disposed in the second portions 100b, for example. The second doped regions 110 can be extending along the Y direction shown in FIG. 1A to form bit lines. Each of the isolation structures 106 can be disposed between two adjacent second doped regions 110, for example, so that adjacent second doped regions 110 are isolated from each other and the punch through phenomenon is prevented from occurring. In one embodiment of the invention, the depth of the isolation structures 106 is deeper than the depth of the second doped regions 110. Hence, the extended perimeters of two adjacent second doped regions 110 do not come in contact with each other. Moreover, the extended perimeters of the second doped regions 110 are isolated from the extended perimeters of the corresponding first doped regions 108 disposed in the same trenches 112. In one embodiment of the invention, the depth of the extended regions of the first doped regions 108 is approximately 0.03 µm to 0.08 µm, and the depth of the extended regions of the second doped regions 110 is approximately 0.03 µm to 0.08 µm.

In addition, referring concurrently to FIGS. 1A and 1C, the memory device according to one embodiment of the invention further includes a plurality of contact plugs 122 and 124 and a plurality of metal conductive lines 126.

The contact plugs 122 and 124 are formed in a dielectric layer 120, and the dielectric layer 120 can be an inter-layer dielectric layer, for example. The metal lines 126 can be extending along the Y direction shown in FIG. 1A and arranged to cross over the word lines. Specifically, the contact plug 122 is disposed on the first doped region 108 and the isolation structures 106, and the contact plug 122 is connected to the first doped regions 108 and the metal lines 126, respectively. The contact plug 124 is disposed on the second doped regions 110, and the contact plug 124 is connected to the second doped regions 110 and the metal lines 126, respectively. In one embodiment of the invention, salicide is formed between the contact plug 122 and the first doped regions 108, or salicide is formed between the contact plug 124 and the second doped regions 110, so that the interface resistance is lowered.

As shown in FIGS. 1A to 1C, the memory device according to embodiments of the invention includes a plurality of memory cells 130, and each of the memory cells 130 can be electrically connected to each other on the X direction via the conductive layer 102 (i.e. the word lines). Moreover, each of the memory cells 130 has a vertical channel region 132, and each of the memory cells 130 is arranged in a mirror symmetric manner, for example but not limited thereto. In one embodiment of the invention, two memory cells 130 disposed in the same trench 112 uses the same second doped region 110. In addition, two memory cells 130 respectively disposed in two adjacent trenches 112 are isolated by the isolation structures 106.

Since there are isolation structures 106 disposed in the substrate 100 between adjacent trenches 112, the vertical channel region 132 of the adjacent memory cells 130 can be effectively isolated. Consequently, operational disturbance arising from secondary electrons between memory cells 130 can be effectively suppressed. Moreover, the adjacent second doped regions 110 can be isolated by use of the isolation structures 106, thereby shrinking the pitch between the adjacent second doped regions 110. Furthermore, the isolation structures 106 prevents the punch through issue in the adjacent second doped regions 110.

Next, a plurality of schematic cross-sectional views is used to further describe the methods for fabricating the memory device in accordance with embodiments of the invention. The processes described hereinbelow are merely a detailed description of the methods of an embodiment of the invention for fabricating the memory device such as one depicted in FIG. 1B, so that persons of ordinary skill in the art can embody the invention. Therefore, the spirit and the scope of the invention should not be limited thereto.

FIGS. 2A-2E are schematic cross-sectional views illustrating processes for fabricating a memory device in accordance with one embodiment of the invention.

Figure 2A:
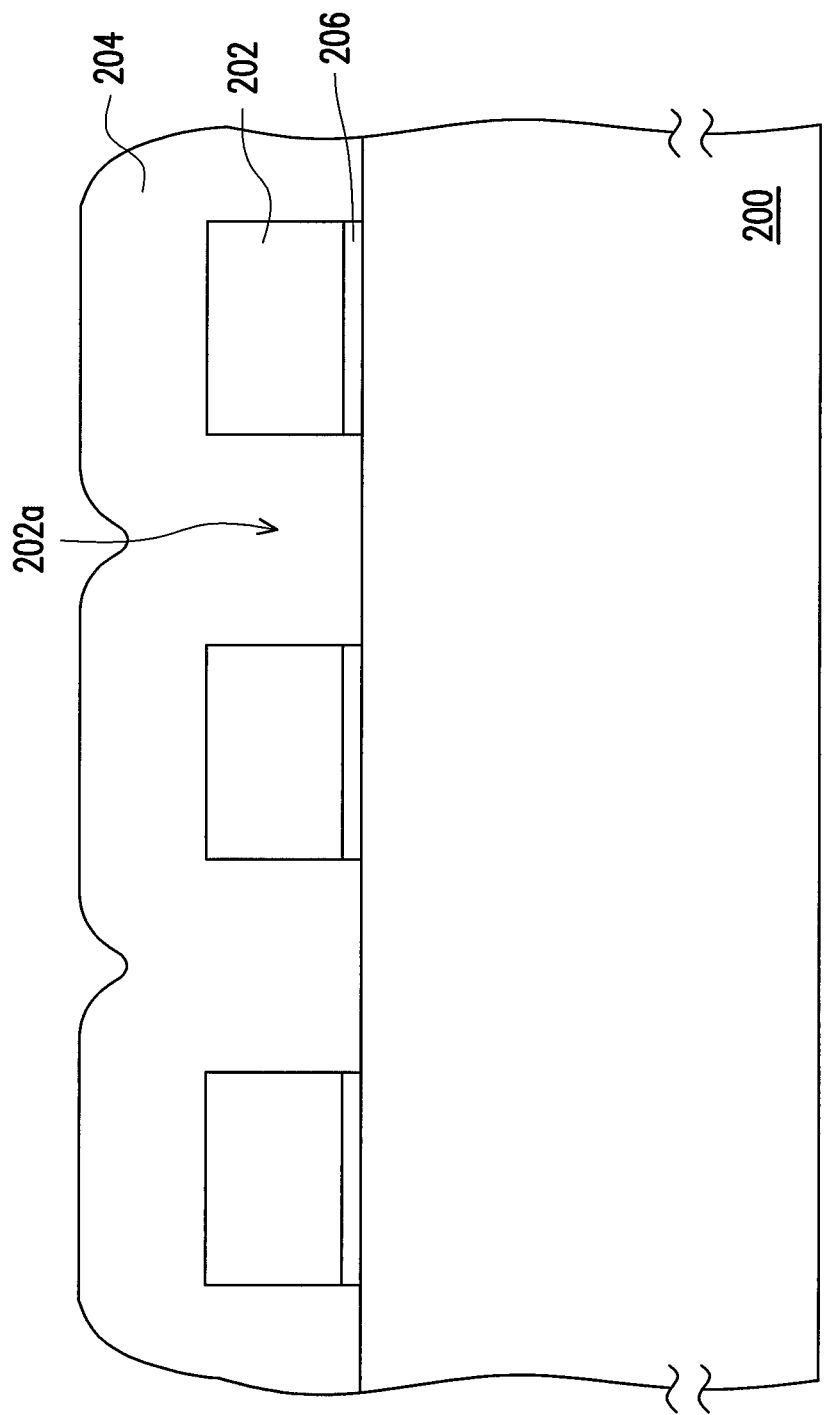
FIGS. 2A-2E are schematic cross-sectional views illustrating processes for fabricating a memory device in accordance with one embodiment of the invention.

Referring to FIG. 2A, a substrate 200 can be a P-type or an N-type substrate. The substrate 200 can be a silicon substrate or other proper semiconductor substrates, for example. In one embodiment of the invention, a plurality of wells (not drawn) can be disposed in the substrate 200. When the memory device is a N-type channel device, the wells can be P-type wells; when the memory device is a P-type channel device, the wells can be N-type wells.

A patterned hard mask layer 202 is formed on the substrate 200. The patterned hard mask layer 202 can have a plurality of openings 202a for exposing a portion of the substrate 200. Thereafter, a spacer material layer 204 is formed on the substrate 200. The spacer material layer 204 can be arranged to cover the patterned hard mask layer 202 and fill the openings 202a. The patterned hard mask layer 202, the spacer material layer 204, and the substrate 200 can have different etching selectivities, for example. In one embodiment of the invention, the material of the patterned hard mask layer 202 can include silicon nitride, and the material of the spacer material layer 204 can include silicon oxide. Furthermore, before forming the patterned hard mask layer 202, a buffer layer 206 can be formed on the surface of the substrate 200. The buffer layer 206 is formed between the patterned hard mask layer 202 and the substrate 200, for example, so as to improve the adhesion of the patterned hard mask layer 202 on the surface of the substrate 200. Moreover, stress is prevented from affecting the substrate 200. The material of the buffer layer 206 includes, for example but not limited to, silicon oxide, and the buffer layer 206 can be formed by implementing the CVD process or the thermal oxidation process.

Figure 2B:
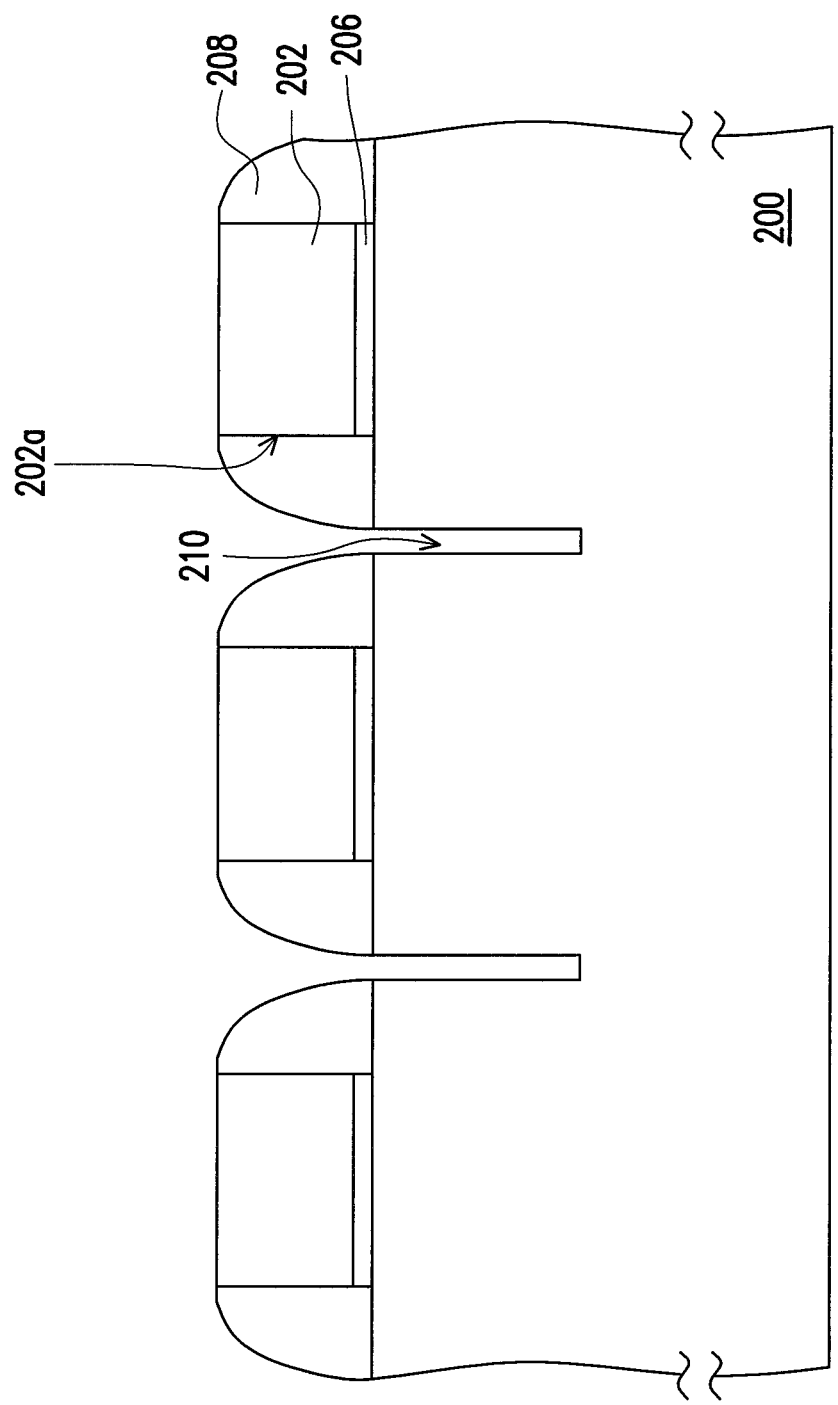

Referring to FIG. 2B, an anisotropic etching process is performed to remove a portion of the spacer material layer 204, and a plurality of spacers 208 is formed on the sidewalls of the patterned hard mask layer 202. Two adjacent spacers 208 disposed in the same openings 202a are not in contact with each other, and a portion of the substrate 200 is exposed by the two adjacent spacers 208 for defining the isolation spaces to be formed thereafter. Next, using the patterned hard mask layer 202 and the spacers 208 as a mask, a portion of the substrate 200 is removed, thereby forming a plurality of isolation spaces 210.

Figure 2C:
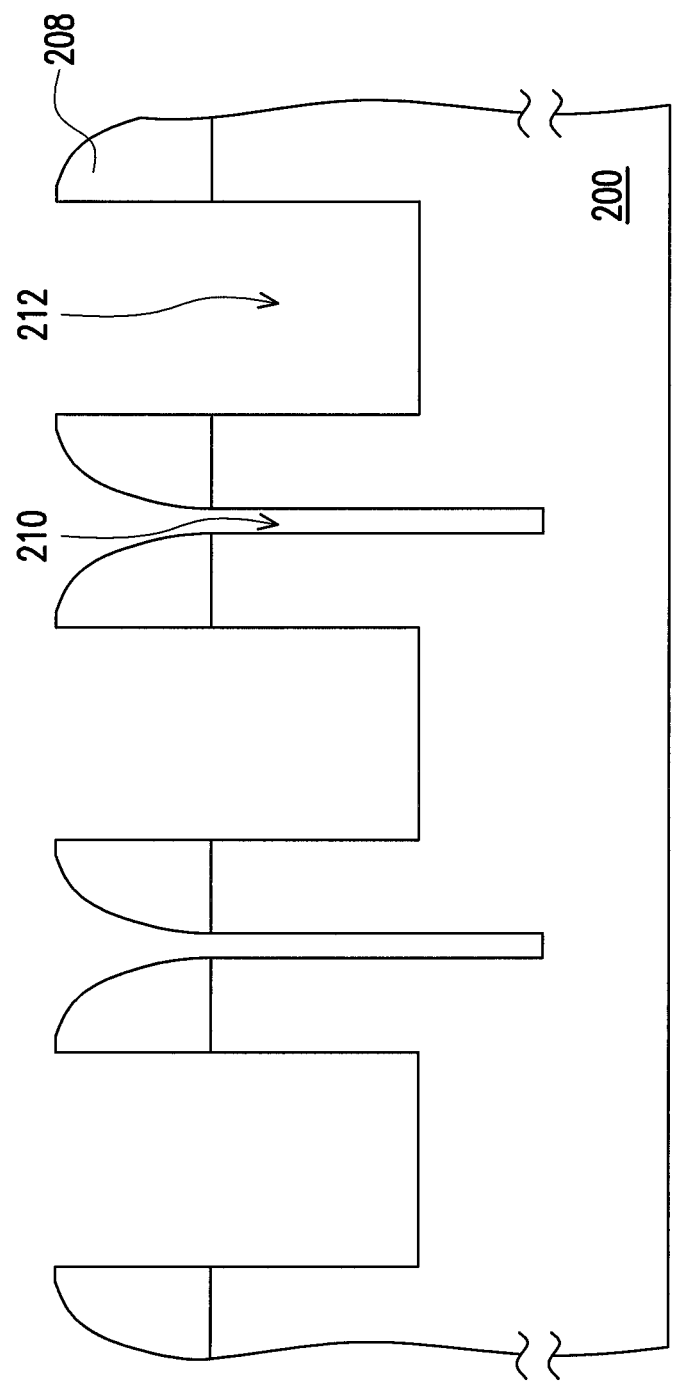

Referring to FIG. 2C, the patterned hard mask layer 202 and the buffer layer 206 are removed to expose a portion of the surface of the substrate 200. Thereafter, using the spacers 208 as a mask, the exposed portion of the substrate 200 is removed to form a plurality of trenches 212. For example, an etching process can be performed to form the trenches 212 by removing the substrate 200. In one embodiment of the invention, while forming the trenches 212, a portion of the substrate 200 disposed in the isolation spaces 210 is also removed, thereby increasing the depth of the isolation spaces 210.

In one embodiment of the invention, the depth of the trenches 212 is approximately 0.15 µm to 0.3 µm, and the width of the trenches 212 is approximately 0.05 µm to 0.25 µm. Moreover, the pitch between adjacent trenches 212 is approximately 0.05 µm to 0.25 µm. In one embodiment of the invention, the depth of the isolation spaces 210 is approximately 0.15 µm to 0.35 µm, and the width of the isolation spaces 210 is approximately 0.005 µm to 0.03 µm, so as to prevent disturbance during programming.

Figure 2D:
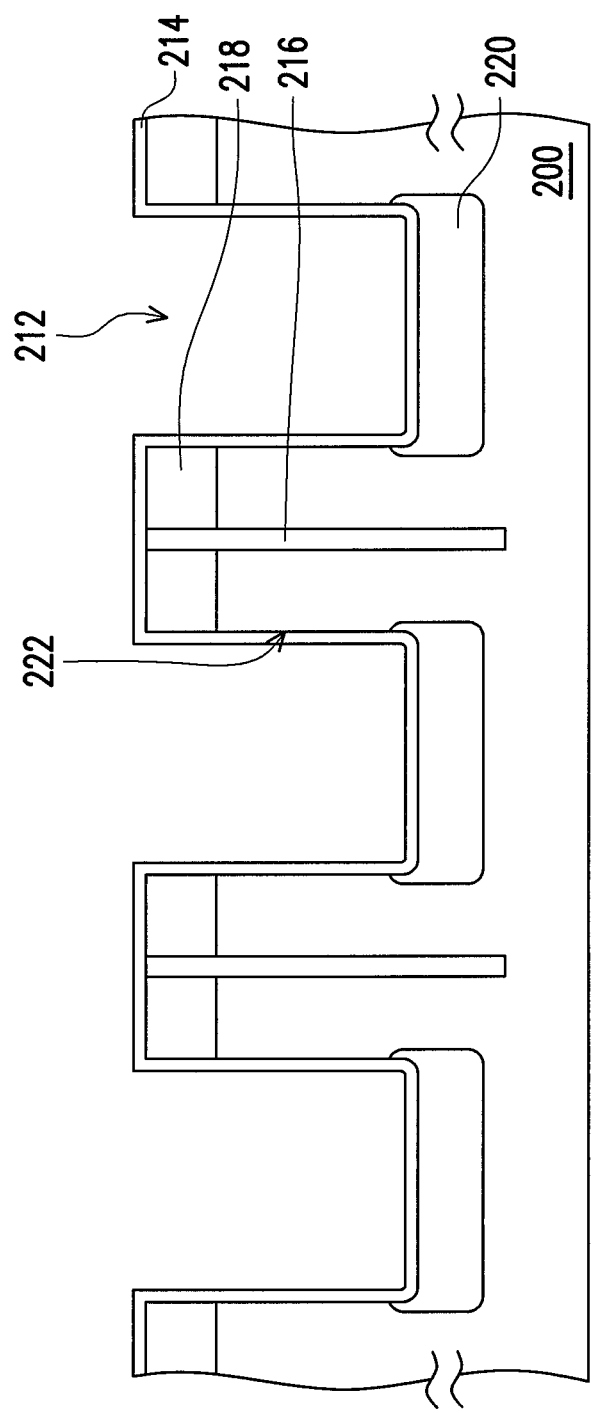

Referring to FIG. 2D, the spacers 208 is removed. Thereafter, an oxidation process is performed in which an oxide layer 214 is conformally formed on the surfaces of the substrate 200 and the trenches 212, and a plurality of isolation structures 216 is formed in the isolation spaces 210. The isolation structures 216 can fill the isolation spaces 210, for example. A thermal oxidation process or a rapid thermal process can be performed to form the oxide layer 214 and the isolation structures 216. The rapid thermal process can be an in-situ steam generation (ISSG) oxidation process, for example.

Next, an ion implantation process is performed to implant a plurality of dopants in the substrate 200, thereby forming a plurality of first doped regions 218 and a plurality of second doped regions 220 in the substrate 200, serving as bit lines. The first doped regions 218 can be respectively formed in the substrate 200 between the trenches 212. More specifically, the first doped regions 218 are respectively disposed in the upper portion of the substrate 200 between each of the isolation structures 216 and the sidewalls of each of the trenches 212. The isolation structures 216 separates two first doped regions 218 disposed between adjacent trenches 212 from each other. For example, the second doped regions 220 can be respectively formed in the substrate 200 under the bottom portion of the trenches 212, and each of the isolation structures 216 can be disposed between two adjacent second doped regions 220. In one embodiment of the invention, the depth of the isolation structures 216 is deeper than the depth of the second doped regions 220, and therefore the extended perimeter of two adjacent second doped regions 220 do not come in contact with each other.

In one embodiment of the invention, the ion implantation energy used during the ion implantation process is approximately 10 KeV~30 KeV, and the implantation dose used is approximately 1E+15~5E+15 $cm^{-2}$. Moreover, the ion implantation process uses a 0° tilt angle, and the dopants are implanted vertically, for example. When the substrate 200 is a P-type substrate, the first doped regions 218 and the second doped regions 220 form N-type doped regions, for example; when the substrate 200 is an N-type substrate, the first doped regions 218 and the second doped regions 220 form P-type doped regions. Furthermore, after performing the ion implantation process, an annealing process can be selectively performed to activate the dopants.

That is, the oxide layer 214 formed on the surface of the trenches 212 is disposed on the vertical channel region 222 of the memory cells to be formed thereafter. Therefore, the bridge fault occurred between first doped regions 218 formed adjacent the top portion of the trenches 212 and the second doped regions 220 formed under the bottom portion of the trenches 212 the oxide layer 214 can during the ion implantation process can be prevented. Consequently, the extended perimeters of the second doped regions 220 are isolated from the extended perimeters of the corresponding first doped regions 218 disposed in the same trenches 212. Moreover, by first performing the oxidation process to form the isolation structures 216, dopants are prevented from implanting in the substrate 200 under the bottom portion of the isolation structures 216. Therefore, issues affecting device performance such as the punch through phenomenon occurring between the adjacent second doped regions 220 can be prevented.

Figure 2E:
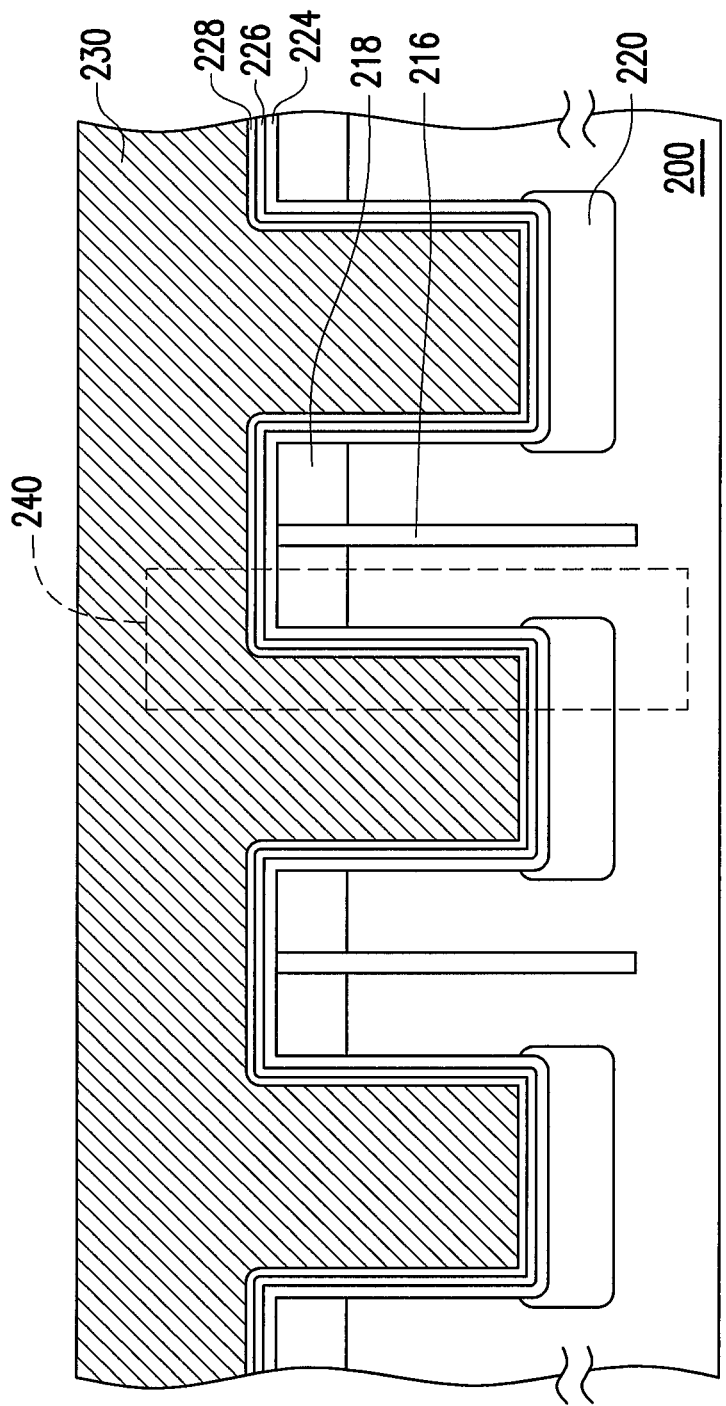

Referring to FIG. 2E, the oxide layer 214 is removed, and then a bottom dielectric layer 224, a charge storage layer 226, and a top dielectric layer 228 are conformally formed in sequence on the surfaces of the substrate 200 and the trenches 212. The material for the bottom dielectric layer 224 includes a low-k or a high-k material, for example but not limited thereto. In one embodiment of the invention, the bottom dielectric layer 224 can be formed in the single layer structure or formed in the bandgap engineered multi-layer structure. The material of the single layer bottom dielectric layer 224 includes, for example but not limited to, silicon oxide or HfAlO. The multi-layer bottom dielectric layer 224 can have the stacked low-k/high-k material structure or the stacked low-k/high-k/low-k material structure, for example the structure can be SiO/HfSiO, SiO/HfO$_2$, SiO/SiN, SiO/SiN/SiO or SiO/Al$_2$O$_3$/SiO. The material of the charge storage layer 226 includes, for example but not limited to, charge-trapping materials such as silicon nitride. The top dielectric layer 228 can include a dielectric material formed in a single layer structure, for example but not limited to SiO, HfAlO, or Al$_2$O$_3$.

Thereafter, a conductive layer 230 is formed on the substrate 200. The conductive layer 230 cover the top dielectric layer 228 and fill the trenches 212, for example. The material of the conductive layer 230 is, for example but not limited to, doped polysilicon, metal, or a combination thereof. Next, the conductive layer 230 is patterned to form word lines.

Additionally, in one embodiment of the invention, an inter-layer dielectric layer, a plurality of contact plugs, and a plurality of metal lines can be formed on the substrate 200, thereby completing the fabrication of the memory device in accordance with one embodiment of the invention. It should be noted that the specifics of the fabrication process and the formation order for the above-mentioned components such as the inter-layer dielectric layer, the contact plugs, and the metal lines are known to persons of ordinary skill in the art, therefore further description are omitted herein.

The memory device formed according to the aforementioned methods includes a plurality of memory cells 240. Moreover, each of the single memory cells 240 has a vertical channel region 222, and each of the memory cells 240 is arranged in the mirror symmetric manner, for example but not limited thereto. In one embodiment of the invention, a same second doped region 220 is shared by two memory cells 240 disposed in a same trench 212. Moreover, the vertical channel regions 222 of two memory cells 240 disposed in two adjacent trenches 212 are isolated by the isolation structures 216. Consequently, the operational disturbance generated by secondary electrons between the memory cells 240 can be effectively suppressed. Since the isolation structures 216 can isolate adjacent second doped regions 220, the pitch between adjacent second doped regions 220 can be effectively reduced. Therefore, not only is storage density increased by each of the memory cells 240 having the vertical channel region 222, the device dimensions of the memory cells 240 can be decreased by the isolation structures 216.

In summary, according to the above-described embodiments of the invention, the memory device and the fabrication methods thereof have at least the following advantages:

1. According to the above-described embodiments of the invention, the memory device includes the isolation structures for isolating the vertical channel regions of two adjacent memory cells, as well as isolating the doped regions disposed under the bottom portion of two adjacent trenches. Therefore, within the same array area, the integrity of the memory cells having the vertical channel regions can be further increased, and when operating each of the bits, the disturbance between each bit is effectively suppressed.

2. According to the above-described embodiments of the invention, the methods for fabricating the memory device include first performing the oxidation process to form the isolation structures between two adjacent trenches. Therefore, issues such as the punch through phenomenon are prevented from occurring in the doped regions formed under the bottom portion of the adjacent trenches.

3. According to the above-described embodiments of the invention, the methods for fabricating the memory device include first performing the oxidation process before performing the ion implantation process to form the doped regions, thereby forming the oxide layer on the surface of the vertical channel region. Therefore, bridging is prevented between the doped regions formed adjacent the upper portion of the trenches and the doped regions formed under the bottom portion of the trenches.

4. The methods for fabricating the memory device according to the above-described embodiments of the invention can be applied in all of the charge trapping memory structures. Furthermore, the methods can be easily integrated in the readily available semiconductor fabrication processes. Moreover, the methods can effectively reduce the size of the memory cells and increase the storage density.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A memory device, comprising:
   a substrate having a plurality of trenches;
   a conductive layer disposed on the substrate and filling the trenches;
   a charge storage layer disposed between the substrate and the conductive layer;
   a plurality of isolation structures disposed in the substrate between the trenches;
   a plurality of first doped regions respectively disposed in an upper portion of the substrate between each of the isolation structures and each of the trenches; and
   a plurality of second doped regions respectively disposed in the substrate under a bottom portion of the trenches, wherein each of the isolation structures is disposed between two adjacent second doped regions.

2. The memory device as claimed in claim 1, wherein a depth of the isolation structures is deeper than a depth of the second doped regions.

3. The memory device as claimed in claim 1, wherein a depth of the isolation structures is approximately between 0.15 μm to 0.35 μm.

4. The memory device as claimed in claim 1, wherein a width of the isolation structures is approximately between 0.005 μm to 0.03 μm.

5. The memory device as claimed in claim 1, further comprising:
- a bottom dielectric layer disposed between the charge storage layer and the substrate; and
- a top dielectric layer disposed between the charge storage layer and the conductive layer.

6. A memory device, comprising:
- a substrate having a plurality of first portions and a plurality of second portions, each of the first portions having a first upper surface having a first height, each of the second portions having a second upper surface having a second height, wherein the first height is higher than the second height;
- a conductive layer disposed on the substrate and covering the first upper surface and the second upper surface;
- a charge storage layer disposed between the substrate and the conductive layer;
- a plurality of isolation structures respectively disposed in the first portions of the substrate;
- a plurality of first doped regions respectively disposed in the first portions of the substrate, and the first doped regions are respectively disposed at two upper sides of each of the isolation structures; and
- a plurality of second doped regions respectively disposed in the second portions of the substrate, wherein each of the isolation structures is disposed between two adjacent second doped regions.

7. The memory device as claimed in claim 6, wherein a depth of the isolation structures is deeper than a depth of the second doped regions.

8. The memory device as claimed in claim 6, wherein a depth of the isolation structures is approximately between 0.15 μm to 0.35 μm.

9. The memory device as claimed in claim 6, wherein a width of the isolation structures is approximately between 0.005 μm to 0.03 μm.

10. The memory device as claimed in claim 6, further comprising:
- a bottom dielectric layer disposed between the charge storage layer and the substrate; and
- a top dielectric layer disposed between the charge storage layer and the conductive layer.

11. A memory device, a cross-section structure of the memory device comprising:
- a substrate;
- a conductive layer disposed on the substrate, wherein the cross-section structure is a cross-section along an extension direction of the conductive layer;
- a charge storage layer disposed between the substrate and the conductive layer; and
- a plurality of isolation structures respectively disposed in a plurality of doped regions of the substrate, wherein the isolation structures are adjacent and parallel to the doped regions respectively.

12. A memory device, a cross-section structure of the memory device comprising:
- a substrate;
- a conductive layer disposed on the substrate, wherein the cross-section structure is a cross-section along an extension direction of the conductive layer;
- a charge storage layer disposed between the substrate and the conductive layer; and
- a plurality of isolation structures respectively disposed in a plurality of doped regions of the substrate, wherein each of the doped region is a bit line.

* * * * *